United States Patent
Jang

(10) Patent No.: US 10,924,824 B2
(45) Date of Patent: Feb. 16, 2021

(54) METHOD FOR MONITORING POWER CONSUMPTION BASED ON CURRENT SENSING, WIRELESS POWER SENSING DEVICE AND CLOUD DEVICE

(71) Applicant: LG ELECTRONICS INC., Seoul (KR)

(72) Inventor: Ji Hwan Jang, Seoul (KR)

(73) Assignee: LG ELECTRONICS INC., Seoul (KR)

(*) Notice: Subject to any disclaimer, the term of this patent is extended or adjusted under 35 U.S.C. 154(b) by 24 days.

(21) Appl. No.: 16/002,782

(22) Filed: Jun. 7, 2018

(65) Prior Publication Data

US 2018/0359542 A1  Dec. 13, 2018

(30) Foreign Application Priority Data

Jun. 12, 2017  (KR) .................. 10-2017-0073427

(51) Int. Cl.

| | |
|---|---|
| *G01R 15/18* | (2006.01) |
| *G01R 21/08* | (2006.01) |
| *G01R 21/133* | (2006.01) |
| *H04Q 9/00* | (2006.01) |

(52) U.S. Cl.
CPC ............ *H04Q 9/00* (2013.01); *G01R 15/186* (2013.01); *G01R 21/133* (2013.01); *H04Q 2209/40* (2013.01); *H04Q 2209/60* (2013.01)

(58) Field of Classification Search
None
See application file for complete search history.

(56) References Cited

U.S. PATENT DOCUMENTS

| | | | | |
|---|---|---|---|---|
| 9,615,147 | B2* | 4/2017 | Radosavljevic | ......... H04Q 9/00 |
| 9,699,529 | B1* | 7/2017 | Petri | ............... H04Q 9/00 |
| 2011/0006756 | A1* | 1/2011 | Rosewell | ............ G01D 4/002 |
| | | | | 324/140 R |
| 2011/0022242 | A1 | 1/2011 | Bukhin et al. | |
| 2011/0074382 | A1 | 3/2011 | Patel | |
| 2012/0029718 | A1* | 2/2012 | Davis | ................. G05B 15/02 |
| | | | | 700/295 |
| 2013/0211751 | A1* | 8/2013 | Park | ..................... G01R 21/06 |
| | | | | 702/61 |
| 2014/0028282 | A1* | 1/2014 | Perry | ................. G01R 21/133 |
| | | | | 324/76.11 |

(Continued)

OTHER PUBLICATIONS

Australian Examination Report dated May 27, 2019 issued in Application 2018204126.

(Continued)

*Primary Examiner* — Curtis A Kuntz
*Assistant Examiner* — Jerold B Murphy
(74) *Attorney, Agent, or Firm* — KED & Associates LLP

(57) ABSTRACT

The present disclosure relates to a method for monitoring power consumption based on current sensing, a wireless power sensing device, and a cloud device. The wireless power sensing device includes a current-acquisition unit configured to sense current flowing in an electrical wire and to generate a current value; a control unit configured to apply the current value by a supply voltage to the electrical wire to calculate a power value; and a communication unit configured to transmit the power value to a cloud device in a predetermined manner.

17 Claims, 11 Drawing Sheets

(56) References Cited

U.S. PATENT DOCUMENTS

| | | | | |
|---|---|---|---|---|
| 2014/0368351 A1* | 12/2014 | Coutelou | ............... | G01D 4/002 |
| | | | | 340/870.02 |
| 2015/0002137 A1 | 1/2015 | Patel et al. | | |
| 2015/0253364 A1 | 9/2015 | Hieda et al. | | |
| 2015/0331025 A1* | 11/2015 | Arashima | ............ | G01R 22/063 |
| | | | | 702/62 |
| 2016/0195864 A1* | 7/2016 | Kim | .................... | H04L 12/2829 |
| | | | | 709/221 |
| 2017/0090004 A1* | 3/2017 | Marshall | .............. | G01R 22/061 |
| 2018/0048484 A1* | 2/2018 | Gelonese | .............. | H04L 12/283 |
| 2019/0249895 A1* | 8/2019 | Weyant | .................... | H02J 3/14 |

OTHER PUBLICATIONS

Shijian Su et al., "Home energy management system using smart socket with appliance recognition," 2016 IEEE International Conference on Information and Automation 9ICIA) Aug. 1-3, 2016, Abstract.

Bradford Campbell et al., "Gemini: A Non-invasive, Energy-Harvesting True Power Meter," 2014 IEEE Real-Time Systems Symposium, Dec. 2-5, 2014, Abstract.

Sanket Thakare et al., "Implementation of an energy monitoring and control device based on IoT," 2016 IEEE Annual India Conference (INDICON), Dec. 16-18, 2016, Abstract.

* cited by examiner

METHOD FOR MONITORING POWER CONSUMPTION BASED ON CURRENT SENSING, WIRELESS POWER SENSING DEVICE AND CLOUD DEVICE

CROSS-REFERENCE TO RELATED APPLICATION

This application claims priority under 35 U.S.C. § 119 to Korean Application No. 10-2017-0073427 filed on Jun. 12, 2017, whose entire disclosure is hereby incorporated by reference.

BACKGROUND

1. Field

The present disclosure relates to a method for monitoring power consumption based on current sensing, a wireless power sensing device, and a cloud device.

2. Background

In-house electric devices are saving energy using a variety of approaches. However, a consumer identifies the energy saving in a limited degree. The power consumed by the electric device may vary depending on performance and operating conditions of the electric device. Further, checking how much power each device consumes may make it possible to control the power usage pattern of the electric devices.

However, in order to check the power consumption of the in-house electric devices, it is necessary to install a separate device to check the power usage into a distribution board receiving the power from the outside. Electrically connecting the power usage checking device to the distribution board is dangerous and difficult for ordinary people.

Further, it need not checking the energy usage of the electric devices only when the user is within the house. Rather, when the user is out of the house, the user may monitor the power usage of the electric devices disposed in the house and reconfigure the power consumptions between the electric devices, thereby to achieve energy saving.

BRIEF DESCRIPTION OF DRAWINGS

The embodiments will be described in detail with reference to the following drawings in which like reference numerals refer to like elements wherein.

DETAILED DESCRIPTION

Figure 1:
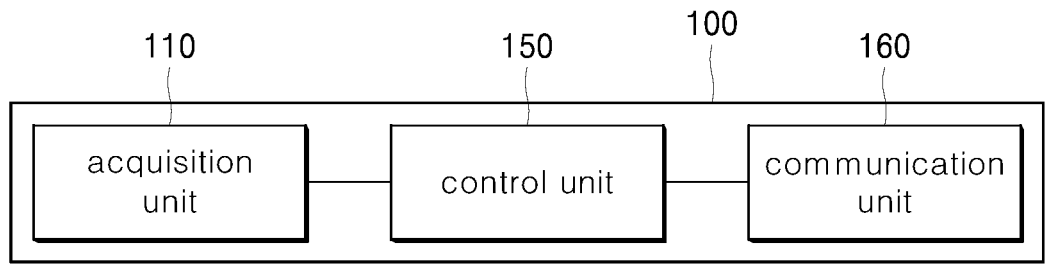
FIG. 1 is a diagram illustrating a configuration of a wireless power sensing device according to one embodiment of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The same reference numbers in different figures denote the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Further, for convenience of description, various components for implementing the present disclosure will be described. In this connection, a plurality of components may be implemented in a single device or module. Alternatively, a single component may be implemented in a distributed manner in multiple devices or modules.

Identifying the amount of power used by several electric devices, for example, a home electric device, a communication device, etc. in a building or in a house may provide for saving power usage by controlling the power usage of the electric devices. However, accurately identifying the amount of power usage of each device may require collecting both the amount of electric voltage and the amount of electric current in the building or the house and calculating the amount of electric power based on the collected voltage and current. However, this requires installing a device for sensing current in the distribution board that provides electricity to the house. In this connection, a separate work is required to install such a current sensing device in a completed building. Further, the distribution board is generally installed by an electrician. The public may not easily install the distribution board. Thus, there is a limit to structurally changing a building or adding components thereto in order to install the device for sensing the current.

Thus, according to the present disclosure, a configuration is provided that facilitates installation of a smart power meter device that calculates power usage. According to the present disclosure, a CT (current transformer) sensor is disposed within the distribution board to sense the amount of power. To this end, the smart power meter device including the CT sensor senses a current value, multiplies the sensed current value by a fixed voltage value supplied by the power source, and transmits the calculated power value to a cloud device. The cloud device may then calculate the power usage of each in-house device and a total power consumption using the transmitted power value and parameters pre-stored in a database. Hereinafter, a building or a house space accommodating a plurality of electric devices therein may be referred to as a sensed space in which the power consumption of the devices disposed therein is sensed. Further, a device that is placed in the distribution board that supplies power to the sensed space and implements smart power metering may be referred to as a smart power meter device. The smart power meter device may constitute a component of the present disclosure and may be referred to herein as a wireless power sensing device.

FIG. 1 shows a configuration of a wireless power sensing device according to one embodiment of the present disclosure. The wireless power sensing device 100 may include a current-acquisition unit (or a current-acquisition device) 110 configured for acquiring a current value using inductive power generation, a control unit 150 configured for converting the acquired current value into a value suitable for transmission to a cloud device, and a communication unit 160 configured for directly or indirectly transmitting the converted value to the cloud device 160

The current-acquisition unit 110 may sense or determine the current flowing in a wire and generate a current value based on the sensed or determined current. In particular, the current-acquisition unit 110 may supply a drive power for operating the wireless power sensing device 100, and may include a battery for this purpose. Further, the current-acquisition unit 110 may be disposed adjacent to a power source in the distribution board and generate inductive power, and may then supply the drive power for the wireless power sensing device 100 using the generated inductive power.

The control unit (or control device) 150 calculates a power value by applying the current value received from the current-acquisition unit 110 by a supply voltage to the electric wire. The control device 150 receives the current value, and determines a power value based on a supply voltage to the electrical wire and the current value. The calculated power value is an apparent power. Accordingly, the wireless power sensing device 100 transmits the calculated power value to the cloud device, and, then, the cloud device calculates an active power by multiplying the calculated power value by a power factor.

The current value and the power value derived therefrom continuously change over time. Accordingly, the control unit 150 may gather the values at regular intervals and calculate differences between neighboring values and send the differences as compressed power values. For example, when the gathering interval is 1 second, the control unit may gather a first power value for a first one second, and subsequent power values for subsequent seconds, and calculate differences between the neighboring values and send the differences as compressed power values to the cloud device. In this way, the communication unit 160 transmits data of a reduced size.

The communication unit 160 transmits the power value to the cloud device in a preset manner. In this process, identification information of the wireless power sensing device 100 may also be transmitted to the cloud device. The power value and identification information may be accumulated and stored in the cloud device. A communication device such as a smart phone, a tablet, or a home automation device for monitoring the power consumption in the sensed space in which the wireless power sensing device 100 is installed may check change of the power value using the identification information.

In brief, the control unit 150 may gather power values at regular temporal intervals and calculate differences between neighboring power values and send the differences as compressed power values via the communication unit 160 to the cloud device. In this connection, the communication unit 160 may transmit the compressed power value and ID information of the wireless power sensing device 100 to the cloud device. Further, the communication unit 150 may receive a gathering-interval change message to change the gathering interval from the cloud device. The control unit 150 may change the gathering interval in response to the message. This is illustrated in more detail in FIG. 10.

Figure 2:
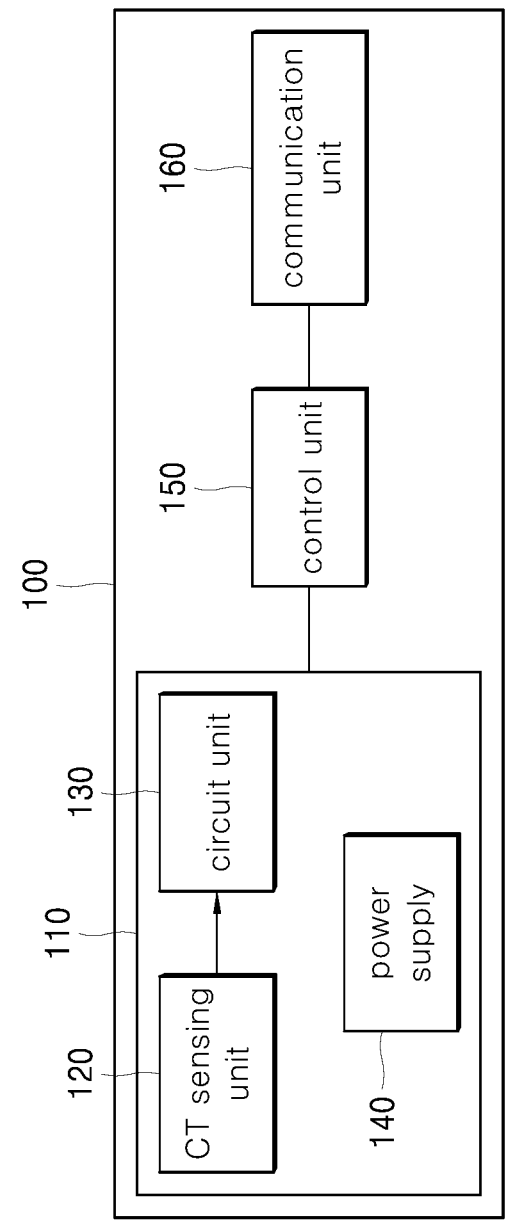
FIG. 2 is a diagram illustrating a detailed configuration of a current-acquisition unit according to another embodiment of the present disclosure.

FIG. 2 shows a detailed configuration of the current-acquisition unit according to another embodiment of the present disclosure. The current-acquisition unit 110 of the wireless power sensing device 100 includes a CT sensing unit 120, a circuit unit 130, and a power supply 140.

The CT sensing unit (or sensor) 120 has an electrical wire disposed at a center thereof, and generates inductive power from electricity flowing in the electrical wire, thereby providing the induced power to the circuit unit 130. The circuit unit 130 is configured for rectifying and acquiring a small signal, and for converting AC (alternating current) to DC (direct current). The current value thus calculated is supplied to the control unit 150 from the circuit unit 130. The control unit 150 calculates a power value by multiplying the current value by a supply voltage, i.e., a fixed voltage value (for example, 220 V in Korea) supplied from a power source.

The power supply 140 may supply drive power for operating the wireless power sensing device 100 and, to this end, may typically include a battery. Alternatively, when a separate electrical outlet is located within the distribution board, the power supply 140 may be connected to the outlet to provide power.

In summary, the circuit unit 130 rectifies and acquires a small signal sensed by the CT sensing unit 120. The power supply 140 supplies power to the CT sensing unit 120 of the wireless power sensing device.

Alternatively, unlike the manner noted previously in FIG. 1, the power supply 140 may not be connected to the electrical outlet or may not include a battery. Accordingly, the power supply 140 may be supplied with a separate power for generating the inductive power. This is discussed in more detail in FIG. 3.

Figure 3:
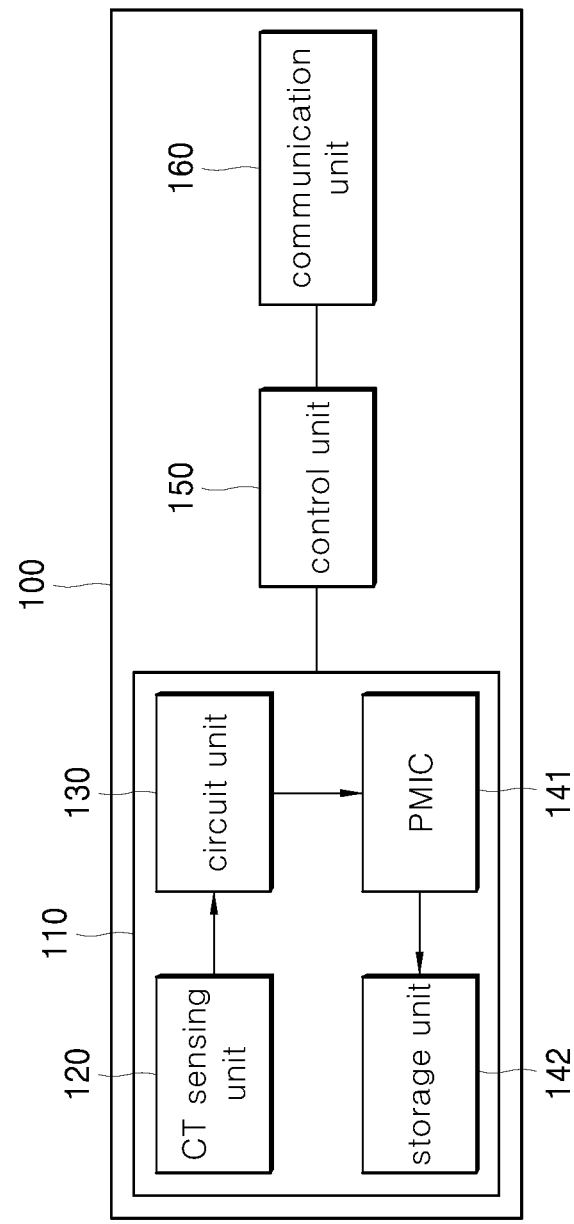
FIG. 3 is a diagram illustrating a detailed configuration of a power supply according to still another embodiment of the present disclosure.

FIG. 3 shows a detailed configuration of a power supply according to another embodiment of the present disclosure. The power supply 140 of FIG. 2 includes a power management integrated circuit (PMIC) 141 and a power storage unit 142.

The circuit unit 130 is configured to rectify the small signal, acquire the signal, and convert the obtained small signal into DC. The circuit unit provides the acquired DC voltage as a supply voltage to the power management integrated circuit 141.

The power management integrated circuit 141 provides the DC voltage to the power storage unit 142. The power storage unit 142 may include a super capacitor and store the supply voltage therein. The storage unit then adjusts the supply voltage to provide power corresponding to the adjusted voltage to the wireless power sensing device 100.

Thus, in one embodiment of the present disclosure, the circuit unit 130 converts the alternating current to direct current and provides the converted direct current to the power management integrated circuit 141. Then, the power management integrated circuit 141 stores the converted direct current to the power storage unit 142. The power storage unit 142 serves as a kind of battery and supplies power.

One example of the communication unit 160 may be a wireless communication unit. A separate gateway device may be placed within the sensed space or near the distribution board. The gateway device receives information on the amount of power transmitted by the communication unit 160 and transmits the information to the cloud device. When the communication unit 160 communicates based on low-power wireless communication (for example, Wi-Fi), the gateway device may also receive the information from the communication unit 160 using wireless communication and transmit the information to the cloud device.

In the embodiment of the wireless power sensing device as shown in FIGS. 1 to 3, the CT sensing unit 120 is connected to the power source inside the distribution board. When an in-home electric device is operated, AC power is generated by the CT sensing unit 120 via an electromagnetic induction. Subsequently, the induced AC power is converted to DC power via the rectifying circuit of the circuit unit 130. The converted DC power is stored in the charging circuit. As a result, the circuit unit 130, the power management integrated circuit 141, and the power storage unit 142 constituting the current-acquisition unit 110 may generate a constant DC voltage. The power management integrated circuit 141 may include an output voltage regulator.

The generated DC voltage is used as a power supply. In this connection, the DC voltage drives the control unit 150, and communication unit 160. In one embodiment, the control unit may be implemented as a MICOM operation control unit. In one embodiment, the communication unit 160 may be implemented as a low power wireless communication circuit. Furthermore, the control unit 150 generates a power value by multiplying the current value provided by the CT sensing unit 120 by a fixed voltage value (for example, 220 V in Korea). The communication unit 160 transmits the power value to the cloud device. Then, the cloud device identifies electrical devices in the space sensed by the wireless power sensing device 100 and provides information on the power consumption of each electrical device to the communication device.

Figure 4:
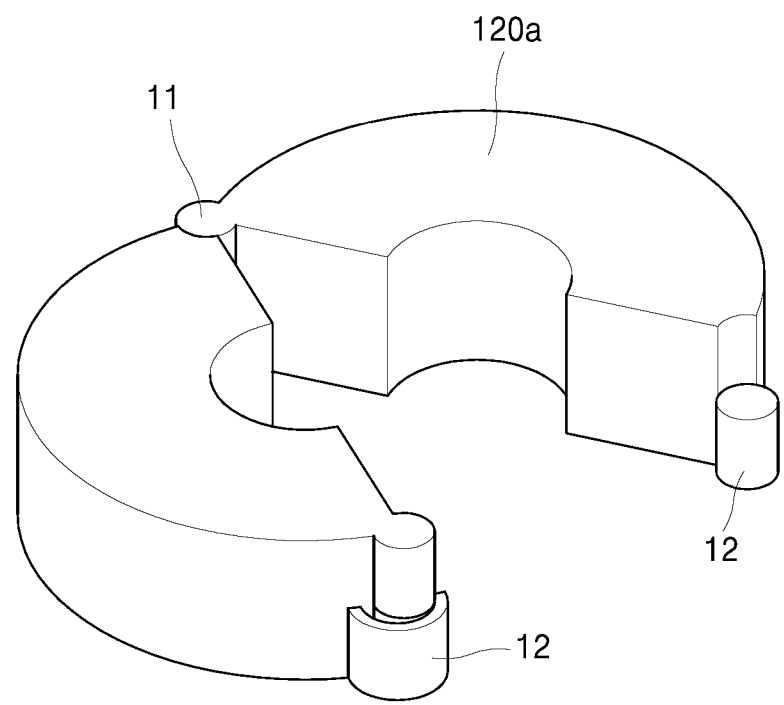
FIG. 4 is a view showing a configuration of a CT sensing unit according to one embodiment of the present disclosure.
Figure 4:
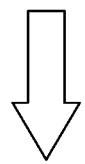
Figure 4:
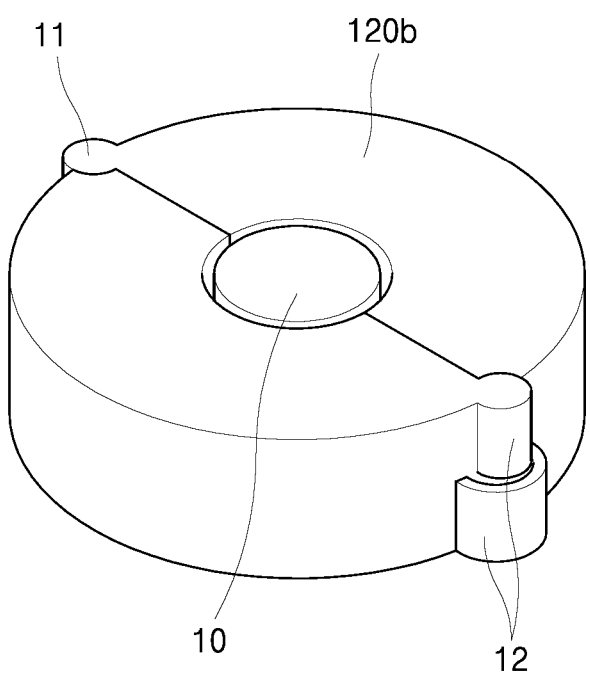

FIG. 4 shows a configuration of a CT sensing unit according to one embodiment of the present disclosure.

The CT sensing unit 120a and 120b is disposed around the electrical wire 10 and senses current flowing in the electrical wire 10. The sensed current value is applied by the supply voltage. The power value is thereby calculated. Regarding the installation of the wire 10, the sensing unit may be opened at one side thereof as in the sensing unit 120a in order to surround the wire 10 as in the sensing unit 120b.

To this end, the CT sensing unit 120a and 120b may include a pivotal portion 11 and fastening mechanism 12. When a fastening mechanism 12 is divided into spaced two portions, the electrical wire 10 may be received in a central cut portion in the CT sensing unit 120a. When the two spaced portions of the fastening mechanism 12 are combined to each other, the electrical wire 10 may be fixed in the CT sensing unit 120b. In this way, the sensing unit may detect a current flowing in the electrical wire 10.

In one embodiment, one wireless power sensing device may include multiple CT sensing units. For example, a distribution board distributes power to multiple sensed spaces. When the electrical wire is branched into sub-wires so that separate power sources are distributed to each sensed space via each sub-wire. Each CT sensing unit is disposed for each of the branched electrical sub-wires. The current value from the electrical wire leading to the corresponding sensed space may be sensed by the corresponding sensing unit.

Figure 5:
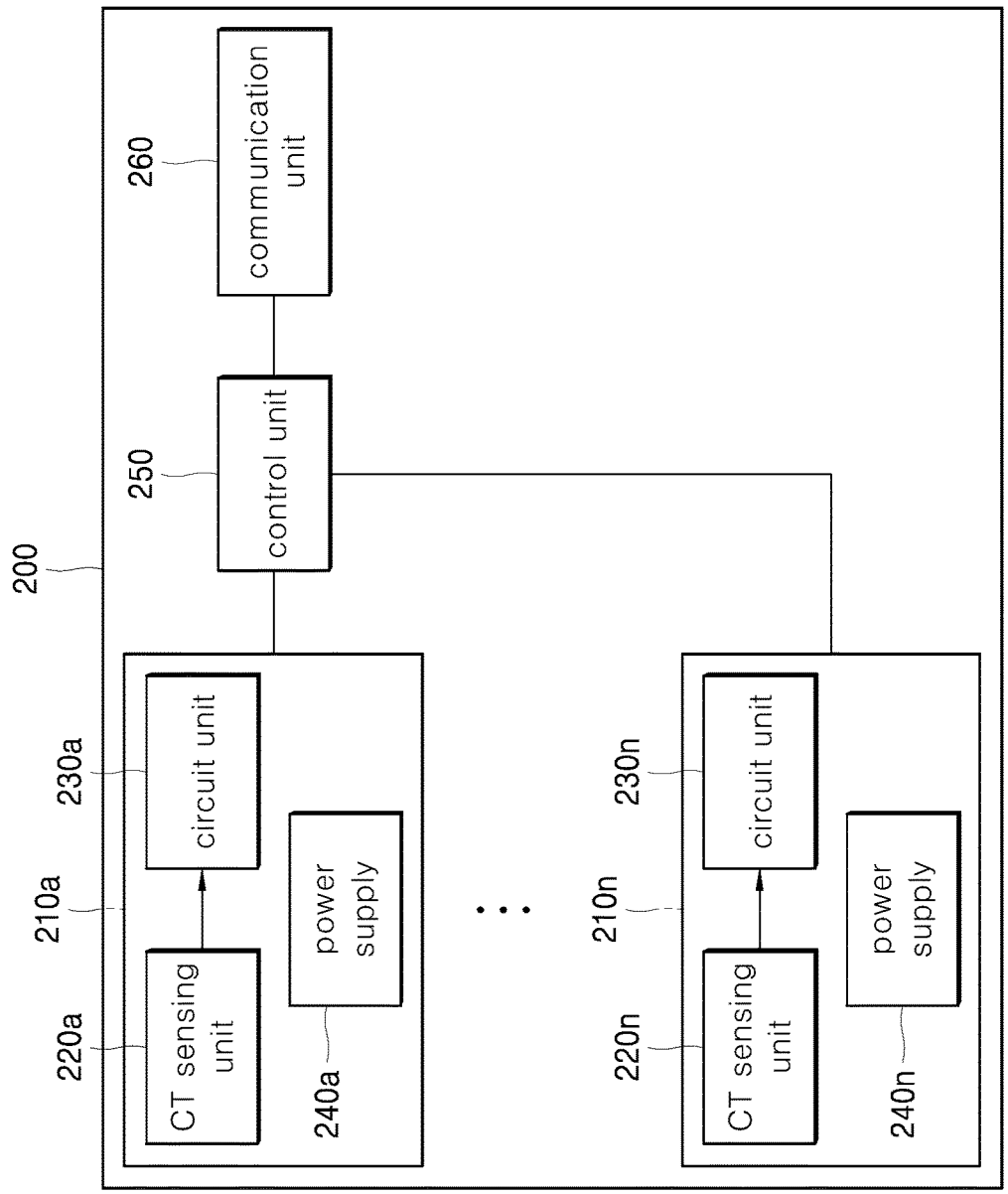
FIG. 5 is a diagram illustrating a configuration of a wireless power sensing device including a plurality of CT sensing units according to one embodiment of the present disclosure.

FIG. 5 is a diagram showing a configuration of a wireless power sensing device including a plurality of CT sensing units according to one embodiment of the present disclosure. The wireless power sensing device 200 includes a communication unit 260 a control unit 250, and n current-acquisition units 210a to 210n. The n current-acquisition units 210a to 210n may be commonly connected to the control unit 250.

The n current values sensed by the current-acquisition units 210a to 210n respectively are provided to the control unit 250. Then, the control unit 250 converts each current value into each power value. Then, the control unit generates identification information of each current-acquisition unit 210a to 210n in connection with each power value. Then, the identification information of each current-acquisition unit 210a to 210n together with each power value may be transmitted to the cloud device by the communication unit 260.

In the embodiment of FIG. 5, respective power supplies 240a to 240n are disposed in respective current-acquisition units 210a to 210n. However, the present disclosure is not so limited. Alternatively, all current-acquisition units 210a to 210n may employ a single common power supply.

Figure 6:
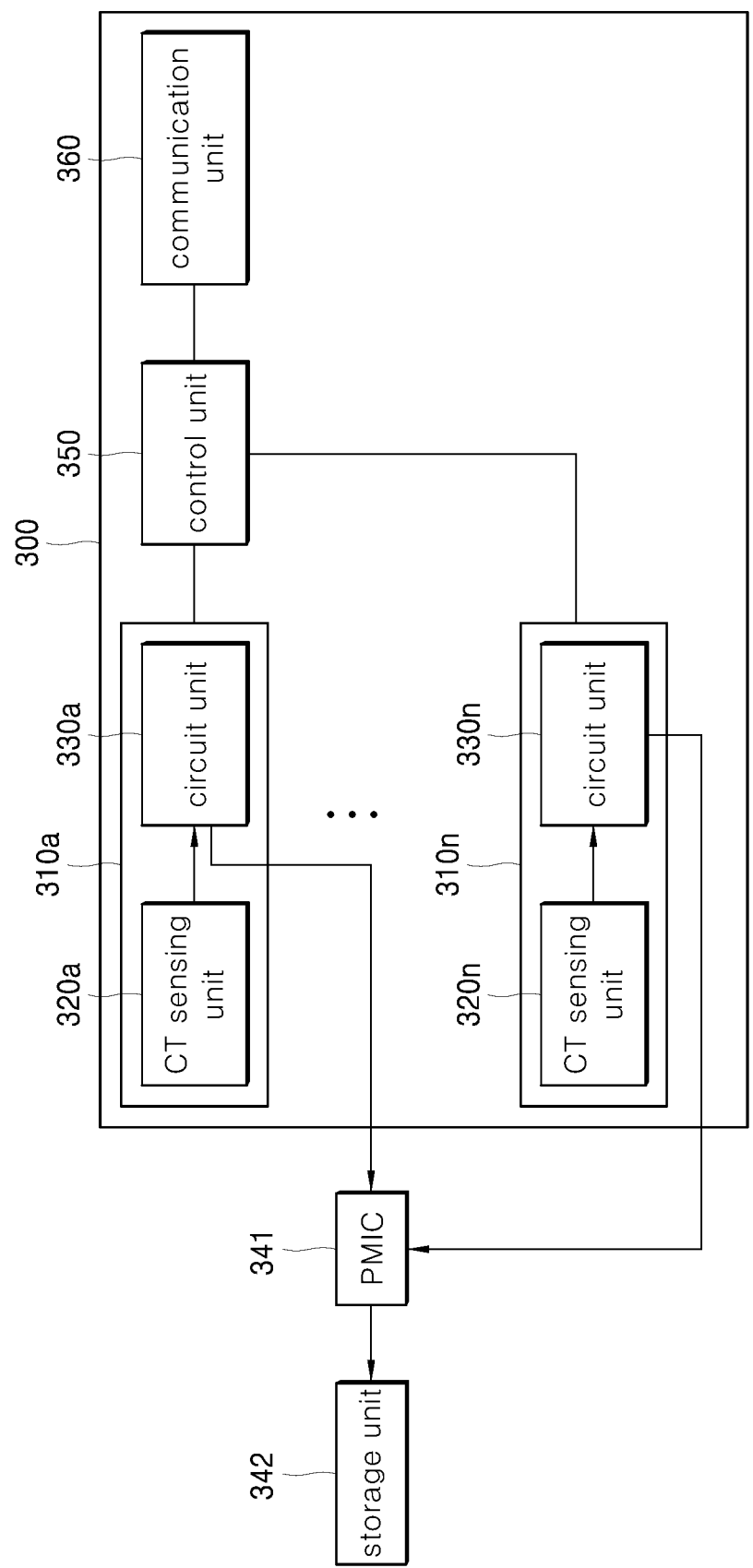
FIG. 6 is a diagram illustrating a configuration of a wireless power sensing device including a plurality of CT sensing units according to another embodiment of the present disclosure.

FIG. 6 shows a configuration of a wireless power sensing device including multiple CT sensing units according to another embodiment of the present disclosure. The wireless power sensing device 300 includes a communication unit 360, a control unit 350, and n current-acquisition units 310a to 310n. The n current-acquisition units 310a to 310n are connected to the control unit 350.

Each of the n current values sensed by each of the current-acquisition units 310a to 310n is provided to the control unit 350. The control unit 350 converts each current value into each power value. Then, the control unit generates identification information of each current-acquisition unit 310a to 310n in connection with each power value. Then, the identification information of each current-acquisition unit 310a to 310n together with each power value may be transmitted to the cloud device by the communication unit 360.

Each circuit unit 330a to 330n of each current-acquisition unit 210a to 210n rectifies and acquires each small signal and converts each of the signals to each DC voltage. Each of the obtained DC voltages is supplied to the power management integrated circuit 341 as a power supply.

The power management integrated circuit 341 provides the DC supply voltage to the power storage unit 342. The power storage unit 342 may include a super capacitor and store the supplied voltage therein. The storage unit then adjusts the supply voltage to provide power to the wireless power sensing device 300.

In summary, the operation of the wireless power sensing device of FIGS. 1 to 6 is as follows. The current value measured by the current-acquisition unit including the CT sensing unit in one embodiment is converted into the power value, and, then, the power value is transmitted to the cloud device.

Using the transmitted power value, the cloud device may identify a home electrical device in the sensed space by using NILM (Non-Intrusive Load Monitoring), which is an example of power-based identification of the home device. Further, the cloud device may collect and classify information about device-based active powers, reactive powers, and power factors for the home devices. Thus, the cloud device may generate and maintain a device-based power factor database.

In other words, the current value measured by the current-acquisition unit including the CT sensing unit in one embodiment is converted into the power value, which, in turn, is transmitted to the cloud device, which, in turn, uses the device-based power factor database for each home device together with each power value, thereby to calculate the active power, reactive power, and power-factor for each device.

In particular, the wireless power sensing device may be located within the distribution board for accurate measurements. In this case, as shown in FIG. 3, the wireless power sensing device 100 including the CT sensing unit may be driven by itself using electromagnetic induction-based harvesting without receiving power from a separate power supply. That is, the wireless power sensing device 100 may inductively generate power without requiring a separate power supply, thereby facilitating the installation of the distribution board.

Further, when the power value is calculated by sensing the current only, the reactive power and active power may not be distinguished from each other. For this reason, the cloud device stores active power, reactive power, and power-factor for each device.

The cloud device applies the NILM to the power value provided from the wireless power sensing device to identify a corresponding device. Thereafter, the cloud device may accurately calculate the power consumption for the identified device by applying corresponding active power, reactive power, and power-factor to the identified device.

A configuration of data generated by the wireless power sensing device of FIG. 1 to FIG. 6 will be described below.

TABLE 1

| Device identification | Sensing time | Power value |
| --- | --- | --- |
| MAC0001 | 10:35 | 150 |
| MAC0001 | 10:36 | 150 |
| MAC0001 | 10:37 | 250 |

The device identification refers to information for identifying a corresponding wireless power sensing device. If the device identification is pre-established between the wireless power sensing device and the cloud device, the device identification may be excluded from Table 1 above. The sensing time refers to a time at which the current is measured.

The power value may be an actually measured value or a converted value of the actually measured value. Further, the power value may be compressed as a difference value between neighboring values as shown in Table 2.

TABLE 2

| Device identification | Sensing time | Power value difference |
| --- | --- | --- |
| MAC0001 | 10:35 | 150 |
| MAC0001 | 10:36 | 0 |
| MAC0001 | 10:37 | +100 |

When as shown in FIG. 5 and FIG. 6, multiple CT sensing units are placed in the distribution board, a separate identification corresponding to each CT sensing unit may be included in the table. This is shown in Table 3 below.

TABLE 3

| Device identification | CT identification | Sensing time | Power value |
| --- | --- | --- | --- |
| MAC0001 | CT001 | 10:35 | 150 |
| MAC0001 | CT001 | 10:36 | 150 |
| MAC0001 | CT001 | 10:37 | 250 |
| MAC0001 | CT002 | 10:35 | 215 |
| MAC0001 | CT002 | 10:36 | 216 |
| MAC0001 | CT002 | 10:37 | 219 |
| MAC0001 | CT003 | 10:35 | 50 |
| MAC0001 | CT003 | 10:36 | 50 |
| MAC0001 | CT003 | 10:37 | 50 |

Table 3 shows an example of sensed current values and corresponding power values when one wireless power sensing device includes three CT sensing units CT001, CT002, and CT003.

Figure 7:
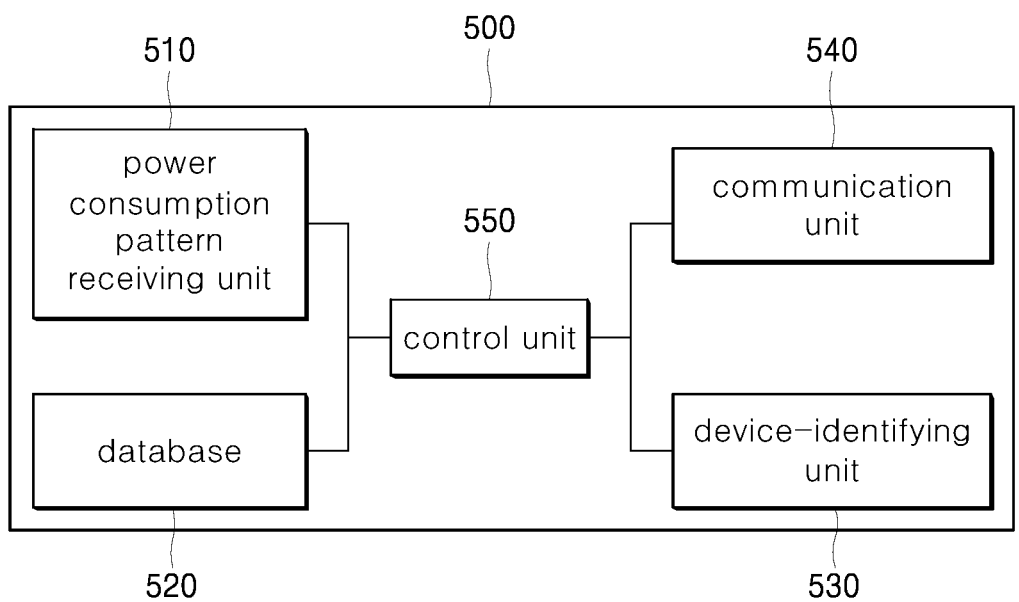
FIG. 7 is a diagram illustrating a configuration of a cloud device according to one embodiment of the present disclosure.

FIG. 7 shows a configuration of a cloud device according to one embodiment of the present disclosure. The cloud device 500 includes a power consumption pattern receiving unit 510, a database 520, a device-identifying unit 530, a communication unit 540, and a control unit 550.

The power-consumption pattern receiving unit 510 receives a power consumption pattern representing a power consumption of each device and/or a total power consumption in the sensed space (as defined on a house basis or on a building-sector basis) where the meter metering the power-consumption of each device is disposed.

The control unit 550 calculates device-based active power, reactive power, and power-factor using the power consumption pattern received by the power consumption pattern receiving unit 510, and stores them in the database 520. Information including the identification, active power, reactive power, and power-factor for each device may be stored in the database 520. Such information may be accumulated continuously in the database. The device identification may largely include device identification information about a device type such as a refrigerator, a TV, a washing machine, etc. The device identification may include detailed device identification information including a manufacturer and model of a corresponding device.

The communication unit 540 receives power consumption in the corresponding sensed space from the wireless power sensing device. That is, the communication unit 540 may receive a power value and an identification of the wireless power sensing device from the wireless power sensing device. The identification of the wireless power sensing device may identify the wireless power sensing device or identify the corresponding sensed space.

In the case of the wireless power sensing device including multiple current-acquisition units in the distribution board, as in the embodiment of FIGS. 5 and 6, each current value sensed by each current-acquisition unit may be converted to each power value.

The wireless power sensing device transmits, to the cloud device, each of the plurality of power values together with identification of each current-acquisition unit or sensed space.

The control unit 550 applies the NILM algorithm built in the device-identifying unit 530 to the received power-consumption pattern to determine the correspondence between electrical devices and power consumptions. That is, the control unit 550 identifies the power consumption of each device or one or more devices disposed in the sensed space corresponding to the identification using the power value received by the communication unit 540. In this connection, the device-identifying unit 530 may apply the NILM algorithm to identify the corresponding device and calculate device-based power-consumption.

The control unit 550 may then calculate a device-based active power by applying a device-based power factor from the database 520 to the identified device and its power-consumption. In one embodiment of the present disclosure, the control unit 550 applies the power-factor stored in the database to the identified device and its power-consumption to calculate at least one of the active power, reactive power, or power-factor for each device.

According to the present disclosure, in order to monitor power usage and determine what type of device is using the power, the control unit 550 and the device-identifying unit 530 may employ NILM (Non-intrusive Load Monitoring), which is one example of a power-consumption identification algorithm, which is implemented in software or hardware form. The NILM is a technique for monitoring a power consumption situation on a power line. The NILM may calculate the power consumption using the power value transmitted by each wireless power sensing device.

That is, when the wireless power sensing device and cloud device according to the present disclosure are implemented, the power line of the distribution board installed in the house or building passes through the CT sensing unit such that the current value derived from the power used by the household device is monitored by the wireless power sensing device. In this way, the current value may be calculated by the power sensing device. The wireless power sensing device may transmit to the cloud device the current value itself or the power value generated by applying the current value by the supply voltage. The cloud device 500 may check the drive state and the power consumption state of the consumer device in the corresponding sensed space using the total current value or the total power value as provided. The control unit 550 of the cloud device 500 first identifies the electrical devices using the device-identifying unit 530. The control unit may then calculate the device-based active power value using the value stored in the database 520 for each electrical device.

Figure 8:
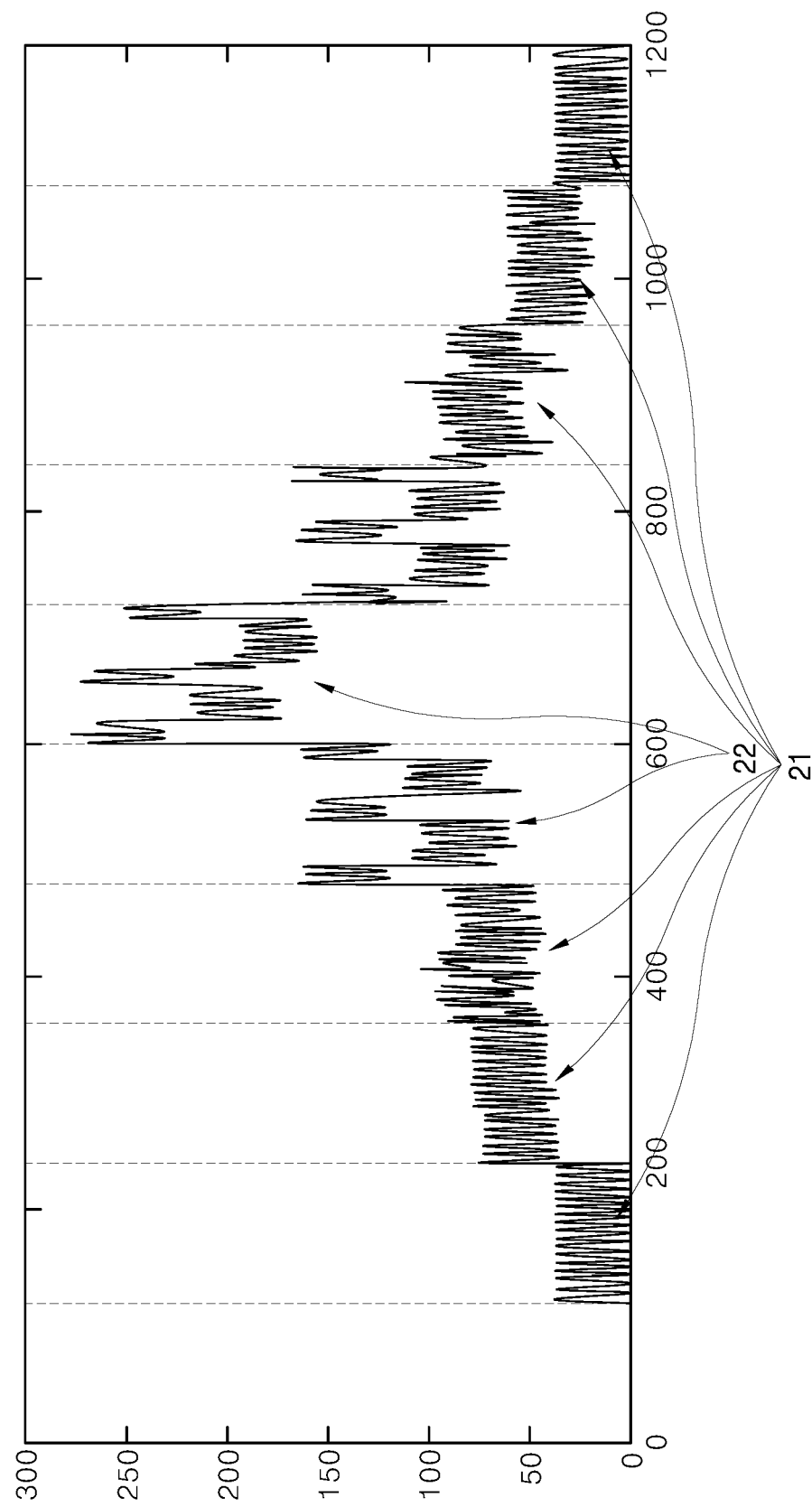
FIG. 8 shows a waveform of power usage according to one embodiment of the present disclosure.

FIG. 8 shows a waveform of power consumption according to one embodiment of the present disclosure. The cloud device 500 may represent the waveform of power-consumption used in a specific sensed space for a specific time. The cloud device may identify the electrical device using the corresponding power using the device-identifying unit 530 thereof. One or more electric devices may be connected to the sensed space. The waveform of the power consumption of the devices may vary depending on whether a power consumption of the devices changes or is constant after the electric devices are turned on. For example, as shown in FIG. 8, there are two type electric devices: one type of the device is turned on and then uses the constant power uniformly, while the other type of the device is turned on and then has power consumption rise or fall. The former type of the device has the waveform as indicated by a reference numeral 21, while the latter type of the device has the waveform as indicated by a reference numeral 22. Accordingly, the device-identifying unit 530 of the cloud device 500 according to the present disclosure may classify the electric devices into a uniform power consumption device and a non-uniform power consumption device.

Furthermore, the cloud device 500 may check on/off states of the electric devices at a point where the magnitude of power consumption is rapidly changed (as indicated by a vertical dotted line), that is, at an inflection point. Accordingly, the device-identifying unit 530 may identify electric devices in use in the currently sensed space based on the sample data on the inflection point and the power usage of the devices.

Figure 9:
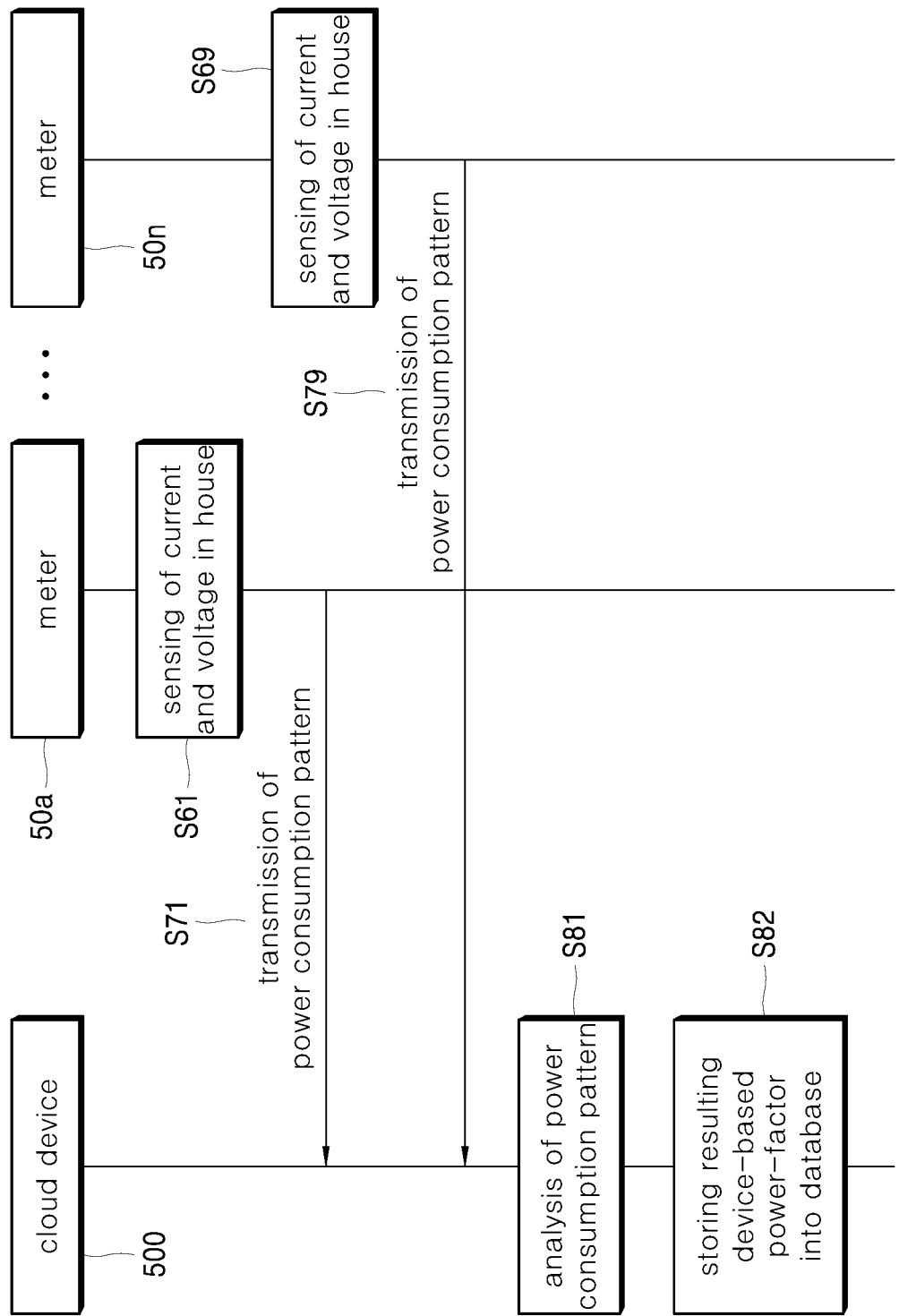
FIG. 9 shows a process in which a cloud device receives power usage patterns. according to one embodiment of the present disclosure.

FIG. 9 shows a process of receiving a power consumption pattern by a cloud device according to one embodiment of the present disclosure. Meters installed in a plurality of houses respectively may sense both voltage and current. A corresponding meter calculates a total power consumption pattern in a corresponding house and transmits the pattern to the cloud device. Alternatively, the corresponding meter meters a magnitude of a device-based power consumption and transmits it to the cloud device. Of course, in this connection, meta information about each house, for example, an area where the house is located (for example, New York or San Francisco, Boston), the type of house (apartment, villa, etc.) may be included in the power consumption pattern. In one embodiment, the power consumption pattern includes a power-consumption for each device in the house. Further, in another embodiment, the power consumption pattern includes a total power consumption of all electrical devices in the corresponding house. In this case, the cloud device may calculate a power consumption per device by applying the total power-consumption to the device identification algorithm contained in the device identifying unit 530 as described above.

The plurality of meters 50a to 50n monitors the voltage values and the current values in the houses (S61, S69).

Them, each meter generates each power consumption pattern in each house and transmit the pattern to the cloud devices (S71, S79). Then, the power-consumption pattern receiving unit 510 of the cloud device 500 receives the power consumption patterns transmitted by the plurality of meters 50a to 50n. Then, the control unit 550 stores the patterns in the database 520.

The power consumption pattern may include the total power consumption value of the devices and/or the power consumption value of each device used in the corresponding house. The meters 50a to 50n are voltage and current sensing devices and accurately sense power consumption. The cloud device 500 analyzes the received power consumption pattern (S81), and stores device-based power factors in the database 520 (S82).

When the power consumption pattern transmitted in operations S71 to S79 includes meta information about each house, the cloud device 500 may also store the meta information in the database. The meta information includes the house area information, the house type information, and the like. The meta information may be used as an auxiliary information when identifying an electric device or applying a power factor based on a power value provided by a corresponding wireless power sensing device. In summary, the control unit 550 calculates the power factor for each electrical device using the received power consumption pattern, and stores the power factor in the database 520. In this connection, the control unit stores the meta information together with the power factor data in the database. Accordingly, the accuracy regarding calculating the device-based power consumption and the total power consumption using the power value transmitted by the wireless power sensing device may be improved.

For example, in computing the power factor or identifying the device, when the corresponding wireless power sensing device is located in a specific area, the cloud device may use the power consumption pattern provided from the corresponding area.

The flowchart in FIG. 9 is briefed as follows. The cloud device 500 obtains power-consumptions from the meters 50a to 50n located in the plurality of houses respectively.

The cloud device 500 applies the NILM as one example of the device-based power identification to the acquired power consumption value, thereby calculating the device-based active power, reactive power, and power-factor. The thus calculated values are stored in the database 520.

Figure 10:
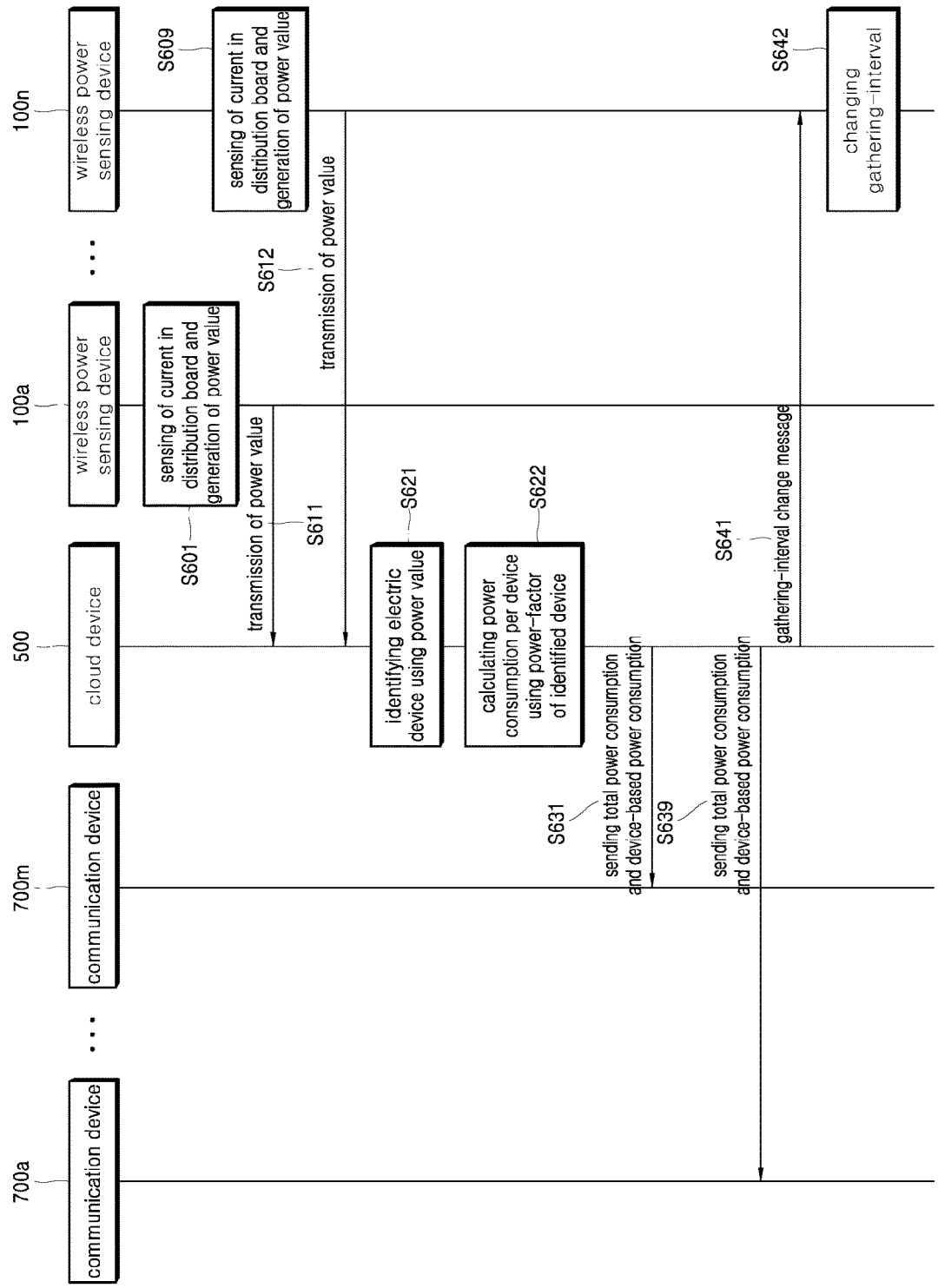
FIG. 10 shows a process in which a cloud device receives a power value from a wireless power sensing device according to one embodiment of the present disclosure.

FIG. 10 shows a process in which a cloud device receives a power value from a wireless power sensing device according to one embodiment of the present disclosure.

Referring to FIG. 10, each of the wireless power sensing devices 100a to 100n senses each current value, converts the sensed value into each power value, and transmits each converted power value to the cloud device 500. The cloud device 500 calculates power consumptions for electrical devices in sensed spaces sensed by the wireless power sensing devices 100a to 100n. The device 500 provides the calculated power consumptions to communication devices 700a to 700m associated with the sensed spaces respectively.

The user may check the device-based power-consumptions as transmitted by the cloud device 500 on the communication devices 700a to 700m. That is, the communication device outputs identifications and power consumptions of the plurality of electric devices disposed in the spaces sensed by the wireless power sensing devices 100a to 100n. The user may check such outputted information.

Specifically, a plurality of wireless power sensing devices 100a to 100n respectively disposed in a plurality of sensed spaces sense currents in respective distribution boards and generate power values based on the currents (S601 to S609). Then, the devices 100a to 100n transmit the respective generated power values to the cloud device 500 (S611 to S619). In this regard, the power values calculated at the gathering interval may be transmitted as uncompressed to the cloud device. Alternatively, differences between neighboring power values among the power values as calculated at the gathering interval may be transmitted as the form of compressed power values.

For example, the cloud device 500 and the power sensing devices 100a to 100n communicate with each other at 10-minute intervals, while the power-consumptions may be calculated on a second basis. Further, in order to reduce the amount of communication data to the cloud device, differences between neighboring power values among the power values as calculated by the wireless power sensing devices 100a to 100n at the gathering interval may be transmitted in the form of compressed power values.

Further, in addition to the power values, separate meta information may be sent to the cloud device. The meta information may include house type information and house location information about the house where the wireless power sensing devices 100a to 100n are disposed. In one example, when one wireless power sensing device includes multiple current-acquisition units, as shown in FIG. 5 or FIG. 6, each current value as sensed in each current-acquisition unit and/or each power value derived therefrom and/or each identification of each current-acquisition unit may be transmitted to the cloud device 500 in operations S611 and S619.

The cloud device 500 identifies the electrical devices disposed in the corresponding sensed spaces using the power values transmitted from the respective wireless power sensing devices 100a to 100n using the information accumulated in the operation of FIG. 9 (S621). The accumulation of the power value shows the waveform as shown in FIG. 8. The device-identifying unit 530 of the cloud device 500 may use the waveform of the accumulated power values to identify the electrical devices.

Further, after the devices are identified, the control unit 550 of the cloud device 500 extracts each device-based power factor from the database 520 and applies the extracted power factor to determine the active power consumption for each device, that is, an actual power consumption for each device (S622).

After the total power-consumptions and device-based power-consumptions are calculated, the cloud device 500 sends the total power-consumptions and device-based power-consumptions to the communication devices 700a to 700m corresponding to the wireless power sensing devices 100a to 100n (S631 to S639). In FIG. 10, n and m may have the same value or different values. In the former case, information about a single sensed space may be provided to a single communication device. In the latter case, information about a plurality of sensed spaces may be provided to one communication device, or conversely, information about a single sensed space may be provided to a plurality of communication devices.

Moreover, the cloud device 500 may newly set the gathering interval at which the wireless power sensing devices 100a to 100n sense or acquire the current values. To this end, the control unit 550 of the cloud device 500 checks the power consumption patterns or power consumption timings of the devices disposed in the sensed spaces where the wireless power sensing devices 100a to 100n are disposed. The control unit 550 may generating the gathering interval change message that requests to adjust the gathering interval to gather the current values. Then, the control unit 550 may control the communication unit 540 of the cloud device 500 to send this message to the wireless power sensing devices 100*a* to 100*n* S641. Then, in response to the reception of the transmitted message, the wireless power sensing devices 100*a* to 100*n* change their current sensing gathering intervals (S642).

Changing the gathering interval at which the current is sensed and gathered allows the wireless power sensing devices to sense the currents effectively. When the electrical devices in specific sensed spaces are not used at a certain time zone, the gathering interval at which the current is sensed and gathered may be adjusted from a second to a minute.

Further, in addition to the gathering interval for sensing and gathering the currents, a transmission interval at which the power values are transmitted may also be adjusted. In the same manner as the operations S641 and S642 as described above, the transmission interval (for example, 10 minutes, 30 minutes, or one hour) of the power value may also be changed.

In summary, the cloud device 500 uses the power values generated by the wireless power sensing devices 100*a* to 100*n* and the information from the database 520 having values accumulated in the operation of FIG. 9, to calculate a power consumption per each device and a total power-consumption over times. Therefore, the user may safely place the CT sensing unit 120 without a separate wired connection into the distribution board. Further, the current values calculated by the CT sensing unit 120 and/or the power values derived therefrom may be analyzed by the cloud device 500. Based on the analysis results, the communication devices 700*a* to 700*m*, such as smart phones may display the power-consumption per device and total power-consumption of the electrical devices over times. Thus, the user may check the power usage situation on the communication devices 700*a* to 700*m*.

Figure 11:
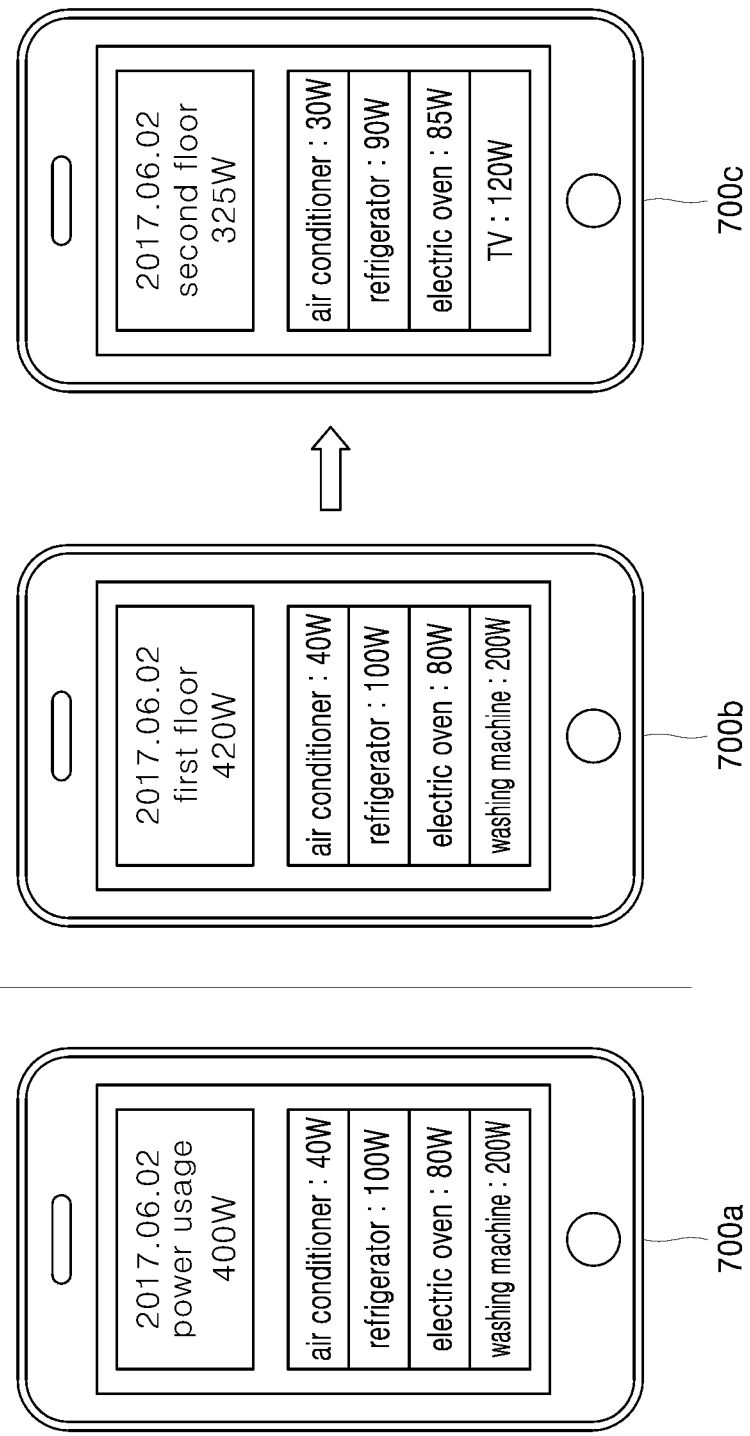
FIG. 11 is a diagram showing a screen of a communication device which receives and display a power of each device and a total power from a cloud device according to one embodiment of the present disclosure.

FIG. 11 is a diagram showing a screen of a communication device which receives and display a power of each device and a total power from a cloud device according to one embodiment of the present disclosure.

A left drawing 700*a* shows a total power-consumption and device-based power-consumption as generated by the cloud device 500 based on the current value as sensed by the wireless power sensing device for one sensed space. Each of a middle drawing 700*b* and right drawing 700*c* shows a total power-consumption and device-based power-consumption as generated by the cloud device 500 based on each current value as sensed by each of the wireless power sensing devices for each of two sensed spaces. in this example, one space is defined as a first floor and the other space is defined as a second floor.

In one embodiment of the present disclosure, different wireless power sensing devices for the two different sensed spaces may sense different current values respectively. As an alternative, as shown in FIG. 5 or FIG. 6, when two electrical sub-wires branching from one distribution board supply power to the two sensed spaces respectively, two current-acquisition units or two CT sensing units may calculate the current values for the two sensed spaces, respectively. In this case, the communication devices 700*b* and 700*c* may display the usage statuses for power consumptions for the two sensed spaces, respectively.

According to the embodiments of the present disclosure, the current-acquisition unit such as the CT sensing unit may conveniently be installed in the distribution board. Further, sensing the current using the sensing unit may lead to the accurate calculation of the power consumption value. Furthermore, in order to distinguish active power from reactive power, the cloud device receives power consumption patterns from houses in which a plurality of voltage meters are located and stores the patterns in the database of the cloud device. Then, the cloud device identifies an electric device associated with each power value and computes a corresponding power-factor. Using the factor, the cloud device may distinguish the active power from the reactive power. This enables monitoring of power-consumption in the house and allows energy savings.

The power meter may be installed on the electrical outlet in the house. This allows the power meter to obtain a power consumption pattern from the corresponding house. When the power meter may not be installed in the house, the wireless power sensing device according to the present disclosure may be installed in the house. When the power meter is installed in the house, the cloud device may monitor the device-based power consumption using the power consumption pattern provided by the power meter.

In particular, the power consumption information is communicated between the cloud device and the communication device. Thus, the user may always check the power usage of the electrical devices in the house. In particular, this eliminates wired connections to sense the power usage. Switching from a wired connection to a wireless connection is made. Further, for power-factor calculation, the cloud device applies, to the current value, the NILM as an example of device-based power discrimination. In this connection, the cloud device may cumulatively store the information obtained from the power meter in the database 520 over times and calculate the device-based power factor using the accumulated information. In this way, the cloud device may increase the measurement accuracy of the active power.

Further, in this regard, various meta information, such as house area information and house type information may be used to improve measurement accuracy. In order to accurately derive the power consumption from the current value, the power factor is employed. The power-factor may be collected by the cloud device 500 in an accumulative manner.

The illustrative block diagrams depict process steps or blocks that may represent modules, segments, or portions of code that include one or more executable instructions for implementing specific logical functions or steps in the process. Although the particular examples illustrate specific process steps or procedures, many alternative implementations are possible and may be made by simple design choice. Some process steps may be executed in different order from the specific description herein based on, for example, considerations of function, purpose, conformance to standard, legacy structure, user interface design, and the like.

Aspects of the present disclosure may be implemented in software, hardware, firmware, or a combination thereof. The various elements of the system, either individually or in combination, may be implemented as a computer program product tangibly embodied in a machine-readable storage device for execution by a processing unit. Various steps of embodiments of the disclosure may be performed by a computer processor executing a program tangibly embodied on a computer-readable medium to perform functions by operating on input and generating output. The computer-readable medium may be, for example, a memory, a transportable medium such as a compact disk, a floppy disk, or a diskette, such that a computer program embodying the aspects of the present disclosure can be loaded onto a computer. The computer program is not limited to any particular embodiment, and may, for example, be implemented in an operating system, application program, foreground or background process, driver, network stack, or any combination thereof, executing on a single processor or multiple processors. Additionally, various steps of embodiments of the disclosure may provide one or more data structures generated, produced, received, or otherwise implemented on a computer-readable medium, such as a memory.

Accordingly, the present disclosure provides a device that more safely senses the amount of current flow in the distribution board, and a device that accurately calculates power consumption based on the current flow.

Further, the present disclosure provides a sensing device that calculates a power value of the electric devices based on current sensing, and a cloud device that is wirelessly connected to the sensing device.

Furthermore, the present disclosure provides a cloud device that calculates a power-factor in order to increase an accuracy at which the cloud device identifies the electrical devices based on the collected power consumptions of the electrical devices.

The purposes of the present disclosure are not limited to the above-mentioned purposes, and, rather, other purposes and advantages of the present disclosure, as not mentioned above, may be understood from the following descriptions. Other objects and advantages will be more clearly understood by reference to the embodiments of the present disclosure. Further, it will be readily appreciated that these objects and advantages of the present disclosure may be realized by features and combinations thereof recited in the claims.

In a first aspect of the present disclosure, there is provided a wireless power sensing device comprising: a current-acquisition unit configured to sense current flowing in an electrical wire and to generate a current value; a control unit configured to apply the current value by a supply voltage to the electrical wire to calculate a power value; and a communication unit configured to transmit the power value to a cloud device in a predetermined manner.

In one embodiment of the first aspect, the current-acquisition unit includes: a CT sensing unit configured to sense the current flow in the electrical wire, wherein the electrical wire is disposed at a center of the CT sensing unit; a circuit unit configured to rectify and acquire a small signal sensed by the CT sensing unit; and a power supply configured to supply power to the wireless power sensing device.

In one embodiment of the first aspect, the power supply includes a power management integrated circuit and a power storage unit, wherein the circuit unit converts alternating current into direct current and provides the direct current to the power management integrated circuit, wherein the power management integrated circuit stores the converted direct current in the power storage unit.

In one embodiment of the first aspect, the control unit is configured to gather power values in a gathering interval and to generate differences between neighboring power values as compressed power values, wherein the communication unit is configured to transmit the compressed power values and identification of the wireless power sensing device to the cloud device.

In one embodiment of the first aspect, the communication unit is configured to receive a gathering-interval change message from the cloud device to indicate change of the gathering interval, wherein the control unit is configured to change the gathering interval in a response to the message.

In a second aspect of the present disclosure, there is provided a cloud device comprising: a communication unit configured for receiving a power value and identification of the power value from a wireless power sensing device; a device-identifying unit configured for identifying one or more electric devices disposed in a sensed space corresponding to the identification using the power value, wherein the device-identifying unit is further configured for identifying a power consumption of each of the electric devices using the power value; and a control unit configured for applying a power factor to the power consumption of the identified device to calculate at least one of an active power consumption, a reactive power consumption, or a power factor of the identified device, wherein the applied power factor is stored in a database.

In one embodiment of the second aspect, the cloud device further includes a power consumption pattern receiving unit configured for receiving a power consumption pattern from a plurality of meters, wherein the control unit is configured to calculate a power factor for each electric device using the received power consumption pattern and to store the calculated power factor in the database.

In one embodiment of the second aspect, the power value received by the communication unit is in a form of a compressed power value, wherein the compressed power value is obtained by the wireless power sensing device gathering power values at a gathering interval and calculating differences between neighboring power values.

In one embodiment of the second aspect, the control unit is configured to generate a gathering-interval change message to indicate change of the gathering interval and to control the communication unit to send the message to the wireless power sensing device.

In a third aspect of the present disclosure, there is provided a method for monitoring power consumption of electric devices based on current sensing using a wireless power sensing device and a cloud device, the method comprising: receiving, by a communication unit of the cloud device, a power value and identification of the power value from the wireless power sensing device; identifying, by a device-identifying unit of the cloud device, one or more electric devices disposed in a sensed space corresponding to the identification using the power value; identifying, by the device-identifying unit of the cloud device, a power consumption of each of the electric devices using the power value; applying, by a control unit of the cloud device, a power factor to the power consumption of the identified device to calculate at least one of an active power consumption, a reactive power consumption, or a power factor of the identified device, wherein the applied power factor is stored in a database; and controlling, by a control unit of the cloud device, the communication unit to transmit the calculated active power consumption to a communication device corresponding to the wireless power sensing device.

In one embodiment of the third aspect, the method further includes receiving, by a power consumption pattern receiving unit of the cloud device, a power consumption pattern from a plurality of meters; calculating, by the control unit, a power factor of each electric device using the received power consumption pattern; and storing, by the control unit, the calculated power factor in the database.

In one embodiment of the third aspect, the method further includes generating, by the control unit, a gathering-interval change message to indicate change of a gathering interval, wherein the wireless power sensing device gathers the power value at the interval; and controlling, by the control unit, the communication unit to send the message to the wireless power sensing device.

According to the present disclosure embodiments, the power-consumption of in-house electric devices may be monitored by simply placing the sensing device into the complex distribution board without having to wire a separate sensing device to the complex distribution board.

Further, according to the embodiments of the present disclosure, power-consumption of electric devices may be checked in real time.

Furthermore, according to an embodiment of the present disclosure, energy may be saved by remotely monitoring the power-consumption of in-house electric devices and reconfiguring the power-consumption pattern.

The effects of the present disclosure are not limited to the effects described above. Those of ordinary skill in the art of the present disclosure may readily derive various effects of the present disclosure from the features of the present disclosure.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section could be termed a second element, component, region, layer or section without departing from the teachings of the present invention.

Spatially relative terms, such as "lower", "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the disclosure are described herein with reference to cross-section illustrations that are schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art Although embodiments of the present disclosure have been illustrated in the accompanied drawings and described in the foregoing description, it will be understood that the disclosure is not limited to the embodiments disclosed, but is capable of numerous rearrangements, modifications, and substitutions without departing from the spirit of the disclosure as set forth and defined by the following claims. For example, the capabilities of the disclosure can be performed fully and/or partially by one or more of the blocks, modules, processors or memories. Also, these capabilities may be performed in the current manner or in a distributed manner and on, or via, any device able to provide and/or receive information. Further, although depicted in a particular manner, various modules or blocks may be repositioned without departing from the scope of the current disclosure.

The foregoing description of the preferred embodiments of the present disclosure has been provided for the purposes of illustration and description. It is not intended to be exhaustive or to limit the disclosure to the precise forms disclosed. Obviously, many modifications and variations will be apparent to practitioners skilled in the art. The embodiments were chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:

1. A wireless power sensing device to be disposed at a distribution board, comprising:
   a plurality of current-acquisition devices, at the distribution board, and each current-acquisition device is configured to separately determine current flowing in a corresponding one of a plurality of electrical wires at the distribution board, and to provide a current value based on the determined current;
   a control device, at the distribution board, and configured to receive the current value from each separate one of the current-acquisition devices, and for each separate one of the current-acquisition devices to determine a power value based on a supply voltage to the corresponding electrical wire and the corresponding current value, wherein the control device is configured to gather a plurality of power values in an interval and to provide, as compressed values, differences between neighboring power values; and
   a communication device configured to transmit, to a cloud device, the compressed differences between neighboring power values and identification information of each of the plurality of current-acquisition devices,
   wherein the power value is used by two or more electric devices in sensed spaces,
   a waveform of the power consumption is varied by on/off states of each of the electric devices or power consumption usage type, and
   wherein the electric device is one of two types, a first type of the electric device is turned on and then uses constant AC power uniformly so that a range of the AC power waveform's rise and fall is uniform, and a second type of the electric device is turned on and then has AC power consumption rise or fall so that the range of the AC power waveform's rise and fall are not uniform, and
   wherein the electric devices are separately and independently classified, at the cloud device, as a uniform power consumption device of first type or as a non-uniform power consumption device of second type based on the received compressed values.

2. The wireless power sensing device of claim 1, wherein each of the current-acquisition devices separately includes:
   a current transformer (CT) sensor configured to sense the current flowing in the corresponding electrical wire, wherein the electrical wire is disposed at a center of the CT sensor;
   a circuit configured to receive a small signal sensed by the CT sensor, and to provide a direct current; and
   a power supply configured to supply power to components of the wireless power sensing device.

3. The wireless power sensing device of claim 2, wherein the power supply includes a power management integrated circuit and a power storage,
   wherein the circuit converts alternating current into the direct current, and provides the direct current to the power management integrated circuit,
   wherein the power management integrated circuit stores, in the power storage, the converted direct current.

4. The wireless power sensing device of claim 3, wherein the power management integrated circuit includes a voltage regulator.

5. The wireless power sensing device of claim 2, wherein the CT sensor includes two structures to surround the wire.

6. The wireless power sensing device of claim 2, wherein the circuit converts an alternate current into the direct current.

7. A distribution board comprising the wireless power sensing device of claim 1.

8. The wireless power sensing device of claim 1, wherein the communication device is configured to receive, from the cloud device, an interval change message to indicate change of the interval,
   wherein the control device is configured to change the interval in response to the message.

9. A cloud device comprising:
   a communication device configured to receive, from a wireless power sensing device disposed at a distribution board, a compressed plurality of power values and identification information of each of a plurality of current acquisition devices provided in the wireless power sensing device, wherein the compressed plurality of power values and identification information is received from the wireless power sensing device that gathers power values in an interval and determines differences between neighboring power values;
   a device-identifying unit, at the cloud device, configured to identify two or more electric devices disposed in a sensed space corresponding to the identification information based on the power values, wherein the device-identifying unit is configured to determine a power consumption of each of the electric devices based on the power values; and
   a control device configured to determine at least one of an active power consumption, a reactive power consumption, and a power factor of the identified electric device based on the power consumption and a power factor of the identified electric device, wherein the power factor is stored in a storage device,
   the device-identifying unit, at the cloud device, checks on/off states of the electric devices at a inflection point where a magnitude of power consumption is rapidly changed, and identifies electric devices in use in the sensed space based on a sample data on the inflection point and a power usage of the electric device,
   wherein a waveform of the power consumption is varied by on/off states of each of the electric devices or power consumption usage type,
   wherein the electric device is one of two types, a first type of the electric device is turned on and then uses constant AC power uniformly so that a range of the AC power waveform's rise and fall is uniform, and a second type of the electric device is turned on and then has AC power consumption rise or fall so that the range of the AC power waveform's rise and fall are not uniform, and
   wherein the device-identifying unit, at the cloud device, separately and independently classifies each of the electric devices into a uniform power consumption device of first type or a non-uniform power consumption device of second type based on the received compressed plurality of values.

10. The cloud device of claim 9, wherein the control device is configured to generate an interval change message to indicate change of the interval and to control the communication device to send the message to the wireless power sensing device.

11. The cloud device of claim 9, further comprising a power consumption pattern receiving unit configured to receive a power consumption pattern from a plurality of meters,
   wherein the control device is configured to determine a power factor for each electric device based on the received power consumption pattern, and to store the determined power factor in the storage device.

12. The cloud device of claim 9, wherein the wireless power sensing device comprising:
a plurality of current-acquisition devices, at the distribution board, each current-acquisition device configured to separately determine current flowing in a corresponding one of a plurality of electrical wires, and to provide a current value based on the determined current;
a control device, at the distribution board, and configured to receive the current value from each separate one of the current-acquisition devices, and for each separate one of the current-acquisition devices to determine a power value based on a supply voltage to the corresponding electrical wire and the corresponding current value; and
a communication device configured to transmit, to the cloud device, the compressed differences of neighboring power values and identification information of each of the plurality of current-acquisition devices.

13. The cloud device of claim 12, wherein each of the current-acquisition devices separately includes:
a current transformer (CT) sensor configured to sense the current flowing in the corresponding electrical wire, wherein the electrical wire is disposed at a center of the CT sensor;
a circuit configured to receive a small signal sensed by the CT sensor, and to provide a direct current; and
a power supply configured to supply power to components of the wireless power sensing device.

14. A method for monitoring power consumption of electric devices by using a wireless power sensing device disposed at a distribution board and a cloud device, the method comprising:
receiving, by a communication device of the cloud device, a compressed plurality of power values and identification information of each of a plurality of current-acquisition devices provided in the wireless power sensing device at the distribution board, wherein the compressed plurality of power values and identification information is received from the wireless power sensing device that gathers power values in an interval and determines differences between neighboring power values;
identifying, by a device-identifying unit of the cloud device, two or more electric devices disposed in a sensed space corresponding to the identification information based on the plurality of power values;
identifying, by the device-identifying unit of the cloud device, a power consumption of each of the electric devices based on the power values;
providing, by a control device of the cloud device, a power factor to the power consumption of the identified electric device to determine at least one of an active power consumption, a reactive power consumption, and a power factor of the identified electric device, wherein the power factor is stored in a storage device; and
controlling, by the control device of the cloud device, the communication device to transmit the power consumption to a communication device corresponding to the wireless power sensing device,
wherein a waveform of the power consumption is varied by on/off states of each of the electric devices or power consumption usage type,
the device-identifying unit, of the cloud device, checks on/off states of the electric devices at an inflection point where a magnitude of power consumption is rapidly changed, and identifies electric devices in use in the sensed space based on a sample data on the inflection point and a power usage of the electric devices, and
wherein the electric device is one of two types, a first type of the electric device is turned on and then uses constant AC power uniformly so that a range of the AC power waveform's rise and fall is uniform, and a second type of the electric device is turned on and then has AC power consumption rise or fall so that the range of the AC power waveform's rise and fall are not uniform, and
wherein the device-identifying unit, of the cloud device, separately and independently classifies each of the electric devices into a uniform power consumption device of first type or a non-uniform power consumption device of second type based on the received compressed plurality of values.

15. The method of claim 14, comprising:
sensing, by a CT sensor, the current flowing in an electrical wire, wherein the electrical wire is disposed at a center of the CT sensor;
receiving a small signal sensed by the CT sensor, and providing a direct current; and
supplying power to components of the wireless power sensing device.

16. The method of claim 14, further comprising:
generating, by the control device, an interval change message to indicate change of an interval, wherein the wireless power sensing device gathers the power values at the interval; and
controlling, by the control device, the communication device to send the interval change message to the wireless power sensing device.

17. The method of claim 14, further comprising:
receiving, by a power consumption pattern receiving unit of the cloud device, a power consumption pattern from a plurality of meters;
determining, by the control device, a power factor of each electric device based on the received power consumption pattern; and
storing, by the control device, the determined power factor in the storage device.

* * * * *